(12) United States Patent
Lou

(10) Patent No.: US 6,218,308 B1
(45) Date of Patent: Apr. 17, 2001

(54) METHOD OF MANUFACTURING A CONTACT FOR A CAPACITOR OF HIGH DENSITY DRAMS

(75) Inventor: Chine-Gie Lou, Hsinchu Hsien (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/314,018

(22) Filed: May 19, 1999

(30) Foreign Application Priority Data

Apr. 30, 1999 (TW) ................................................ 88107080

(51) Int. Cl.⁷ .................................................. H01L 21/311
(52) U.S. Cl. ............................................ 438/694; 438/957
(58) Field of Search ..................................... 438/238, 239, 438/240, 253, 254, 255, 689, 694, 957

(56) References Cited

U.S. PATENT DOCUMENTS

| 5,429,980 | * | 7/1995 | Yang et al. ............................... 437/52 |
| 5,506,166 | * | 4/1996 | Sandhu et al. ........................... 437/60 |
| 5,741,721 | * | 4/1998 | Stevens .................................... 437/60 |
| 5,858,838 | * | 1/1999 | Wang et al. ........................... 438/255 |
| 5,893,734 | * | 4/1999 | Jeng et al. ............................. 438/239 |
| 6,066,528 | * | 5/2000 | Fazan et al. ........................... 438/253 |

* cited by examiner

Primary Examiner—Benjamin L. Utech
Assistant Examiner—Kin-Chan Chen

(57) ABSTRACT

A method for manufacturing an integrated circuit capacitor is provided in the present invention. First, a semiconductor substrate is etched to form a contact hole. A polysilicon contact is then formed to fill into the contact hole. A metal layer is formed on the substrate and the polysilicon contact. Next, a silicon catching layer is formed on the metal layer. An annealing step is performed to substitute the silicon contact with a portion of said metal layer for forming a metal contact, wherein the silicon atom are driven to react with the silicon catching layer for forming a compound layer underneath the silicon catching layer. After the metal layer, the silicon catching layer and the compound layer are removed, the first conduction layer is formed on the substrate and the metal contact to serve as a bottom electrode. Then, a dielectric layer is formed along the surface of the first conduction layer. The second conduction layer is next formed on the dielectric layer to serve as a top electrode.

20 Claims, 5 Drawing Sheets

METHOD OF MANUFACTURING A CONTACT FOR A CAPACITOR OF HIGH DENSITY DRAMS

FIELD OF THE INVENTION

The present invention relates to a process for manufacturing semiconductor DRAM cells, and more specifically, to a method for forming a MIM (metal/insulator/metal) structure capacitor.

BACKGROUND OF THE INVENTION

Semiconductor Dynamic Random Access Memory (DRAM) devices have been applied widely in the integrated circuits with the advance of semiconductor manufacture. Typically, a memory cell consists of a storage capacitor and an access transistor for each bit to be stored by the semiconductor DRAM. Either the source or drain of the transistor is connected to one terminal of the capacitor. The other side of the transistor and the transistor gate electrode are connected to external connection lines called the bit line and the word line, respectively. The other terminal of the capacitor is connected to a reference voltage. Thus, the formation of a DRAM memory cell comprises the formation of a transistor, a capacitor and contacts to external circuits.

With the coming of Ultra Large Scale Integrated (ULSI) DRAM devices, the sizes of memory cells have gotten smaller and smaller such that the area available for a single memory cell has become very small. This has caused a reduction in capacitor area, which in turn results in a reduction in cell capacitance. Namely, the amount of the charge capable of being stored by the capacitor decreases. Besides, for very small memory cells, planar capacitors produced has lower reliability in operation. Accordingly, the important issue is how to promote the capacitance and reliability of capacitors with the decreasing scale of the devices and the increasing integration of the integrated circuits.

For resolving the above problems, the manufacture of capacitors tends to increase the surface area of the storage electrode, and results in the development of the various types of capacitors such as the trench capacitor and the stacked capacitor. Besides, the high dielectric films are used for the capacitor. The MIM (metal/insulator/metal) structure capacitors are also used to substitute for the MIS (metal/insulator/silicon) structure capacitors gradually due to the MIM structure capacitors having the excellent conduction character and capacitance. Please refer to FIG. 1, a typical MIM structure capacitor is illustrated. An insulator layer 3 is formed on a semiconductor substrate 1, and a metal plug 7 is formed into the contact hole on the insulator layer 3 to connect electrically the bottom electrode 9 and the active devices (not shown) on the semiconductor substrate 1. A thin dielectric layer 11 is deposited along the surfaces of the bottom electrode 9 and the insulator layer 3. The top electrode 13 is formed on the thin dielectric layer 11. It is noted that a barrier layer 5 is formed along the contact hole firstly (namely along the sidewalls of the insulator layer 3 and the top surface of the substrate 1) before forming the metal plug 7 into the contact hole, to serve as an interface for promoting the junction efficiency between the metal plug 7 and the active devices.

In general, aluminum (Al) is used widely for forming the metal line since aluminum has the lower resistance and good adhension to dielectric materials. However, aluminum can not be fill into the contact holes effectively since the aluminum is always deposited by using the physical vapor deposition (PVD) method semiconductor in manufacture. Especially, it is more difficult to form the aluminum plug into the contact holes with higher aspect ratio.

Therefore, tungsten (W) plug is usually used to take the place of aluminum plug in the MIM structure capacitors in current semiconductor manufacture. Particularly, the tungsten can be deposited by using the chemically vapor deposition (CVD) method results in the step coverage ability of tungsten is better than that of aluminum. However, it is still difficult to form the tungsten plug effectively into the contact holes with the aspect retio more than 10:1. Besides, as described above, the requirement to form Ti/TiN film for serving as the barrier films cause the increasing difficulty to form tungsten plug into the contact holes.

SUMMARY OF THE INVENTION

The prime objective of the present invention is to provide a method for manufacturing the aluminum contact in integrated circuit capacitor.

The second objective of the present invention is to provide a method for manufacturing the DRAM cell with the MIM structure capacitor.

The another objective of the present invention is to form the aluminum contact by substitute the silicon atoms of the polysilicon contact with the aluminum atoms in solid phase by using an annealing procedure.

A method for manufacturing an integrated circuit capacitor is disclosed in the present invention. A semiconductor substrate is etched firstly to form a contact hole. A polysilicon contact is then formed to fill into the contact hole. An aluminum (Al) layer is deposited on the substrate and the polysilicon contact. A titanium (Ti) layer is deposited on the aluminum layer. Next, an annealing step is performed to substitute the polysilicon atoms of the silicon contact in the contact hole with the aluminum atoms of the aluminum layer for forming an aluminum contact in the contact hole, wherein the replaced silicon atoms by the aluminum atoms are driven to react with the titanium layer to form a titanium silicide layer underneath the titanium layer. The aluminum layer, the titanium silicide layer and the titanium layer atop the substrate and the aluminum contact are removed sequently. A first conducting layer is formed on the substrate and the aluminum contact to serve as the bottom electrode. Then, a dielectric film is deposited along a surface of the first conduction layer. A second conducting layer is formed on the dielectric film to serve as the top electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention relates to a method of forming the aluminum contact in the contact hole by using the annealing procedure. A polysilicon contact is formed in the contact hole. Then, the aluminum atoms are driven by the annealing step to substitute for the silicon atoms of the polysilicon contact in solid phase in the contact hole. It is noted that the replaced silicon atoms are driven to react with a titanium layer for forming a titanium silicide layer. Thus, the aluminum contact is formed into the contact hole effectively and completely, and there is no requirement to form the barrier layer such as Ti/TiN before forming the aluminum contact. The detailed processes will be described as follows.

Figure 1:
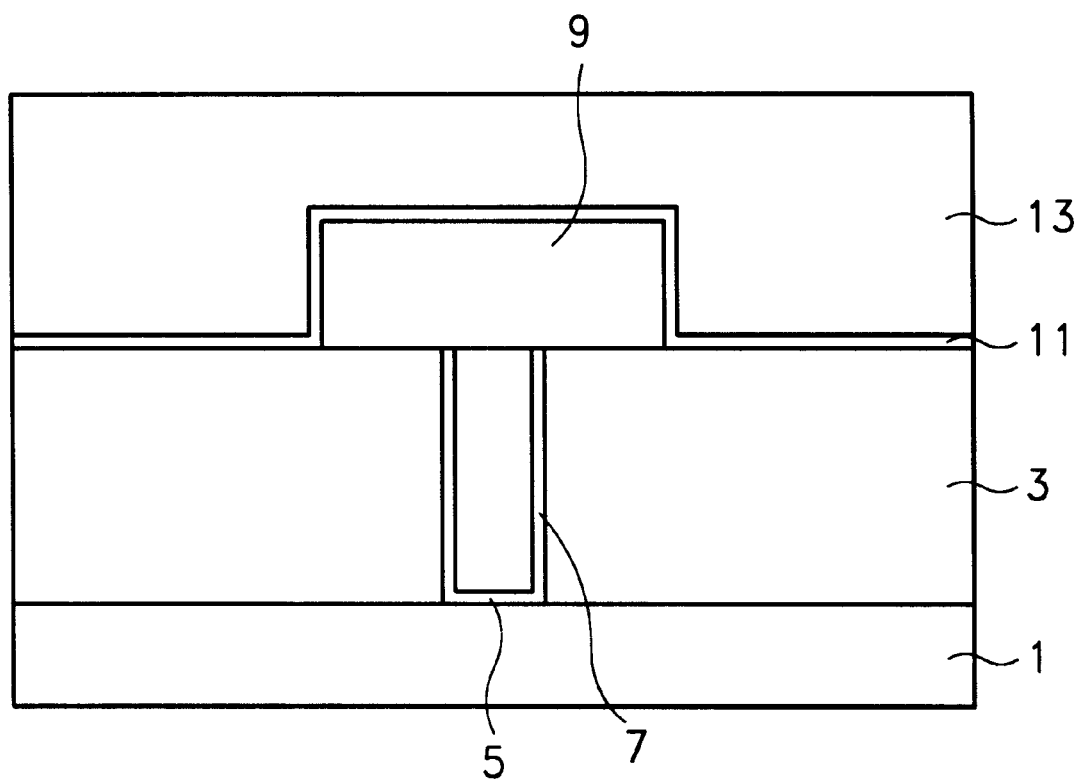
FIG. 1 is a cross sectional view of a semiconductor wafer illustrating the step of forming a stacked box structure capacitor in accordance with the prior art.
Figure 2:
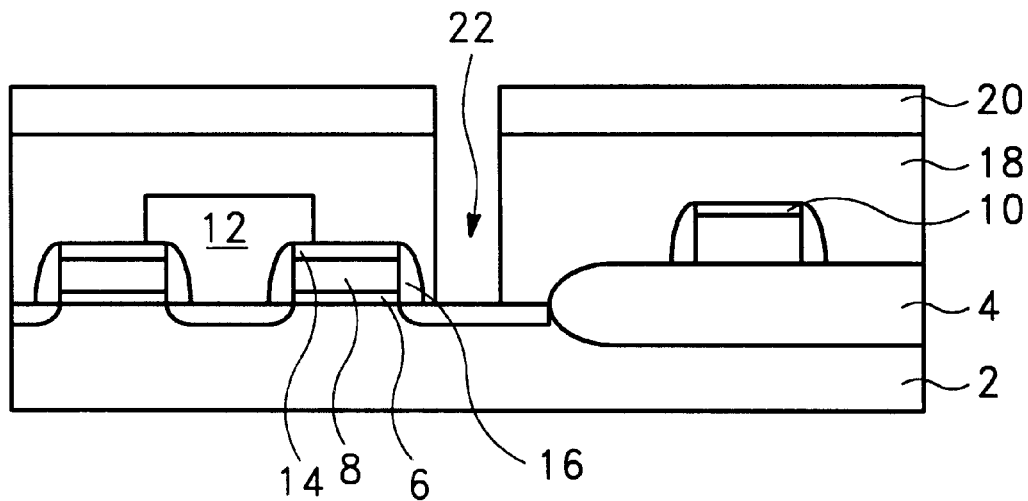
FIG. 2 is a cross sectional view of a semiconductor wafer illustrating the step of forming a contact hole on the semiconductor substrate.

Referring to FIG. 2, a single crystal substrate 2 with a <100> crystallographic orientation is used for the preferred embodiment. A thick field oxide 4 (FOX) region is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in an oxygen-steam ambient is used to form the FOX 4 region, to a thickness of about 3000–8000 angstroms. Then, a silicon dioxide layer 6 is created atop the substrate 2 to use as a gate oxide. In the preferred embodiment, the silicon dioxide layer 6 is formed by using an oxygen-steam ambient, at a temperature between about 750 to 1100° C. In the preferred embodiment, the thickness of the silicon dioxide layer 6 is approximately 30–100 angstroms. Still referring to FIG. 2, after the silicon dioxide layer 6 is formed, a first polysilicon layer 8 is formed over the silicon dioxide layer 6 and the FOX region 4. In the preferred embodiment, the first polysilicon layer 8 is formed by using conventional chemical vapor deposition (CVD) to have a thickness about 1000–5000 angstroms. Then, a word line 10, a bit line 12, gate structures with cap layer 14, and side wall spacers 16, are formed by well known technology and is not particularly germane to the present invention. Thus, only a cursory description of the formation of gate structure is given here.

As shown in FIG. 2, a dielectric layer 18 for isolation is formed on the gate structures , FOX 4 and substrate 2 to a thickness about 3000–8000 angstroms. The dielectric layer 18 is preferably formed of silicon oxide. A nitride layer 20 is subsequently formed on the dielectric layer 18. The nitride layer 20 is used as a stopping layer in latter removing steps. The nitride layer 20 has a thickness at a range about 500–1500 angstroms. Then, a contact hole 22 is formed on the substrate 2. In a preferred embodiment, a photoresist is pattern firstly on the nitride layer 20 to define a region where will be generated a contact hole. An etching is used to etch the dielectric layer 18 and the nitride layer 20 to form the contact hole 22. In one embodiment, a plasma etching is performed to create the contact hole 22 for storage node contact. The etchant to remove oxide is selected from the group of $CCl_2F_2$, $CHF_3/CF_4$, $CHF_3/O_2$, $CH_3CHF_2$, $CF_4/O_2$, while the nitride layer is removed by using $CF_4/H_2$, $CHF_3$ or $CH_3CHF_2$.

Figure 3:
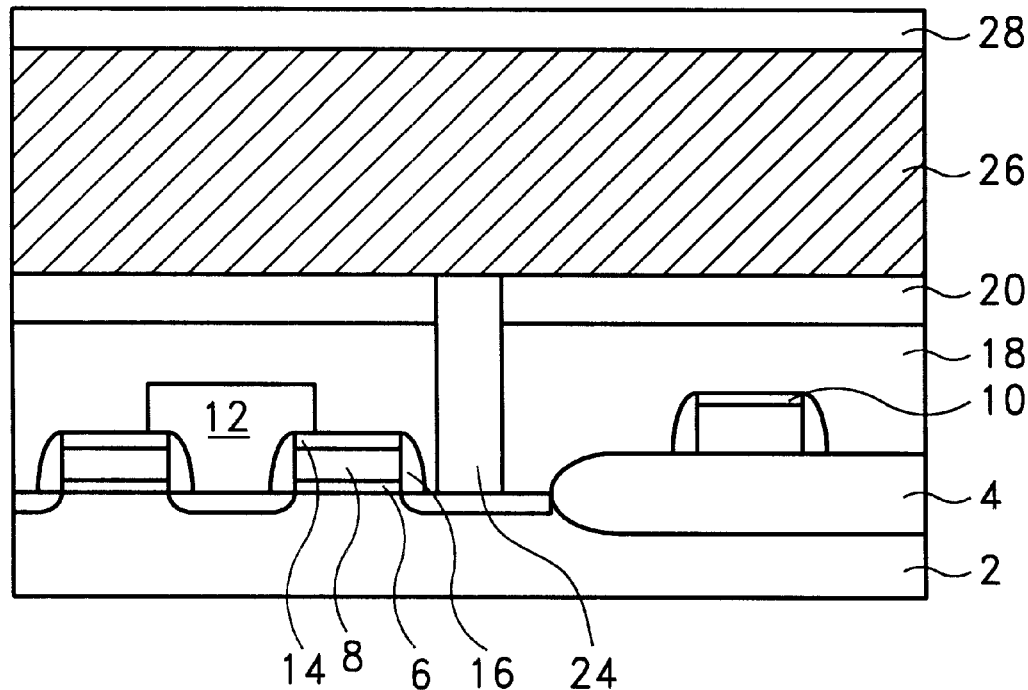
FIG. 3 is a cross sectional view of a semiconductor wafer illustrating the step of forming a polysilicon contact into the contact hole on the substrate.

Turning next to FIG. 3, after the contact hole 22 is formed on the substrate 2, a polysilicon contact 24 is formed into the contact hole 22. In an embodiment, a polysilicon layer is formed on the substrate 2 and filled into the contact hole 22 firstly. Then, an reactive ion etching (RIE) is performed to etch back the polysilicon layer till the nitride layer 20 is reached. Thus, the polysilicon contact 24 is formed in the contact hole 22. In general, the polysilicon layer is formed by using the known CVD method. Besides, the polysilicon layer can be formed also of in-situ doped polysilicon. The etchant to etch the polysilicon layer is $SiCl_4/Cl_2$, $BCl_3/Cl_2$, $HBr/Cl_2/O_2$, $HBr/O_2$, $Br_2/SF_6$ or $SF_6$.

Then, an aluminum layer 26 is formed atop the nitride layer 20 and the polysilicon contact 24. In an embodiment, the aluminum layer 26 with a thickness about 1000 to 4000 angstrom is formed by using the physical vapor deposition (PVD) method at a pressure about 1 to 10 torrs. Next, a titanium layer 28 with a thickness about 500 to 2000 angstrom is formed on the aluminum layer 26 by using the PVD method, to serve as a silicon catching layer for reacting with silicon atoms to form the titanium silicide layer.

Figure 4:
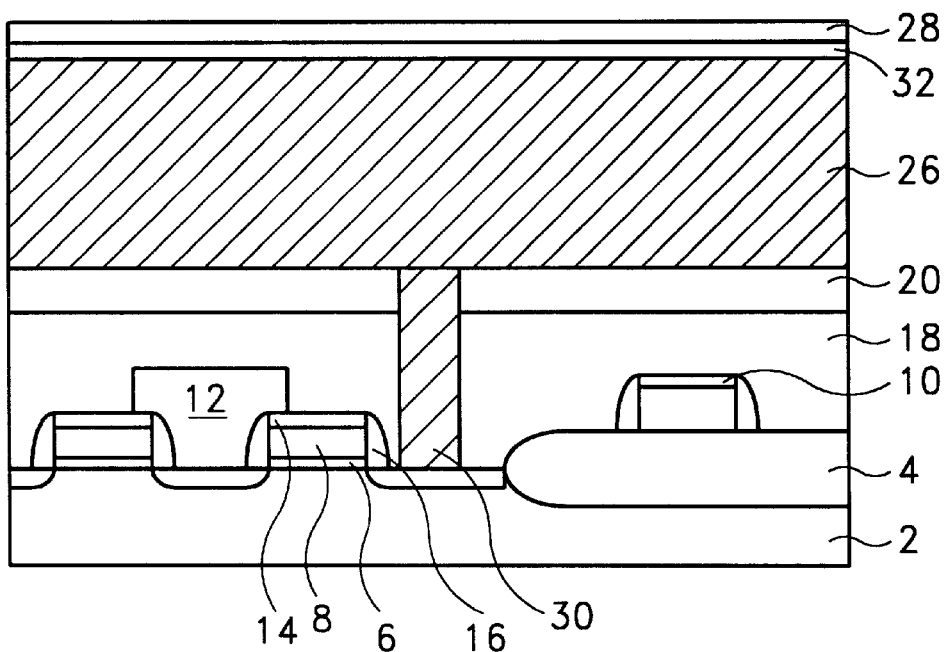
FIG. 4 is a cross sectional view of a semiconductor wafer illustrating the annealing step used to form the aluminum contact in the contact hole.

Then, as shown in FIG. 4, a portion of aluminum layer 26 is used to substitute in solid phase for the polysilicon contact 24 in the contact hole 22 by performing an annealing step. The aluminum atoms of the aluminum layer 26 are driven downward by the annealing step into the contact hole 22 for replacing the silicon atoms of the polysilicon contact 24. It is noted that the silicon atoms of the polysilicon contact 24 to be replaced are driven upward to through the aluminum layer 26 and react with the titanium layer 28 for forming the titanium silicide ($TiSi_x$) layer 32 underneath the titanium layer 28. In a preferred embodiment, the annealing step is performed between about 10 to 80 minutes at a temperature about 400 to 500° C. to substitute the polysilicon contact 24 with the aluminum contact 30.

Figure 5:
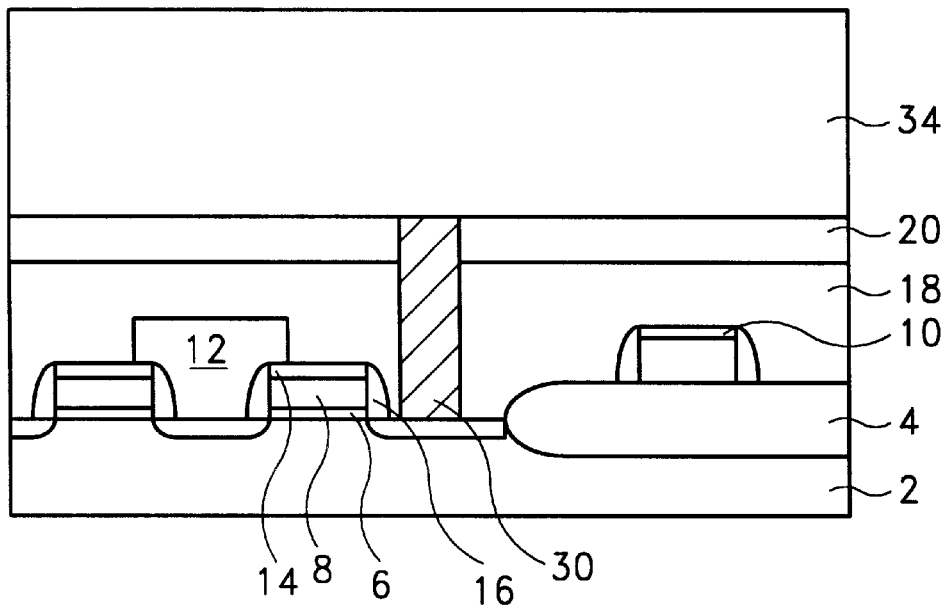
FIG. 5 is a cross sectional view of a semiconductor wafer illustrating the step of forming an oxide layer on the substrate and the aluminum contact.

Refer to FIG. 5, the aluminum layer 26, the titanium silicide layer 32 and the titanium layer 28 above the nitride layer 20 and the aluminum contact 30 are all removed. In an embodiment, a RIE etching step or a chemical mechanic polishing (CMP) procedure is used to perform the removing step. The nitride layer 20 is used to serve as the stop layer in the removing step. After the removing step is done, an oxide layer 34 is formed atop the nitridel layer 20 and the aluminum contact 30. Typically, the oxide layer 34 with a thickness about 3000 to 10000 angstrom can be formed by using chemical vapor deposition (CVD) process, using TEOS as a source at a temperature between about 600 to 800° C., at a pressure 0.1 to 1 torrs.

Figure 6:
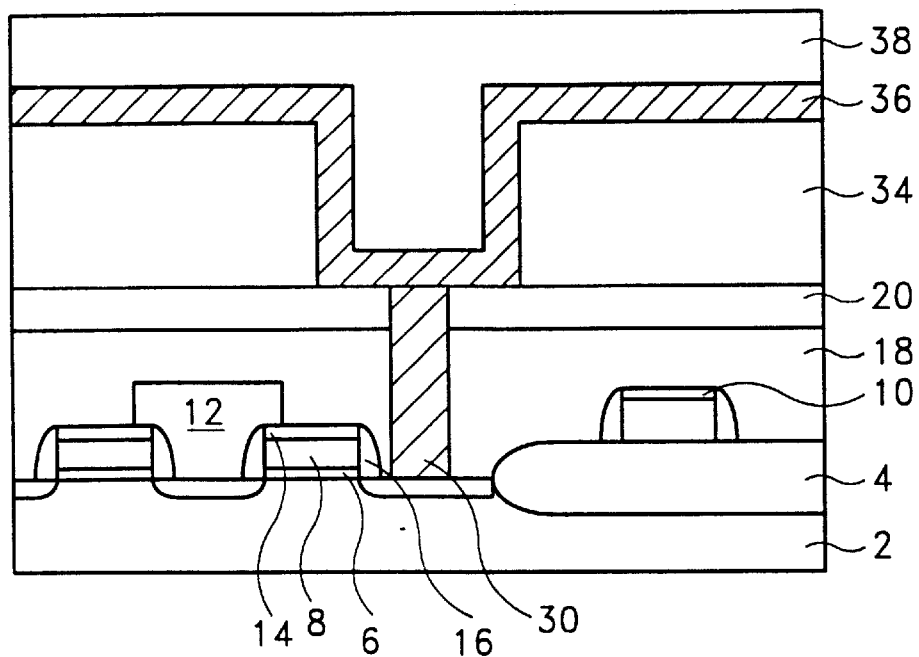
FIG. 6 is a cross sectional view of a semiconductor. wafer illustrating the step of forming the first metal layer to be the bottom electrode of the capacitor.

Then refer to FIG. 6, an opening is formed on the oxide layer 34 to define the crown shaped pattern and expose the top surfaces of the aluminum contact 30 and a portion of the nitride layer 20. In an embodiment, a photoresist is formed on the oxide layer 34 firstly, then patterned by the related photolithography. the photoresist is next used to be an etching mask for etching the oxide layer 34 to form the crown shaped pattern. The etchant to removed oxide is selected from the group of $CCl_2F_2$, $CHF_3/CF_4$, $CHF_3/O_2$, $CH_3CHF_2$ and $CF_4/O_2$.

A first metal layer 36 is subsequently formed on the oxide layer 34, the nitride layer 20 and the aluminum contact to serve as the bottom electrode of the capacitor formed in latter steps. Namely the first metal layer 36 is formed along the surface of the crown shaped structure. In a preferred embodiment, the first metal layer 36 is formed of aluminum. Next, a photoresist 38 is coated to cover the first metal layer 36 for serving as a sacrificial layer. It is noted that the photoresist 38 to be the sacrificial layer can be replaced by the other dielectric material, such as silicon oxide, etc.

Figure 7:
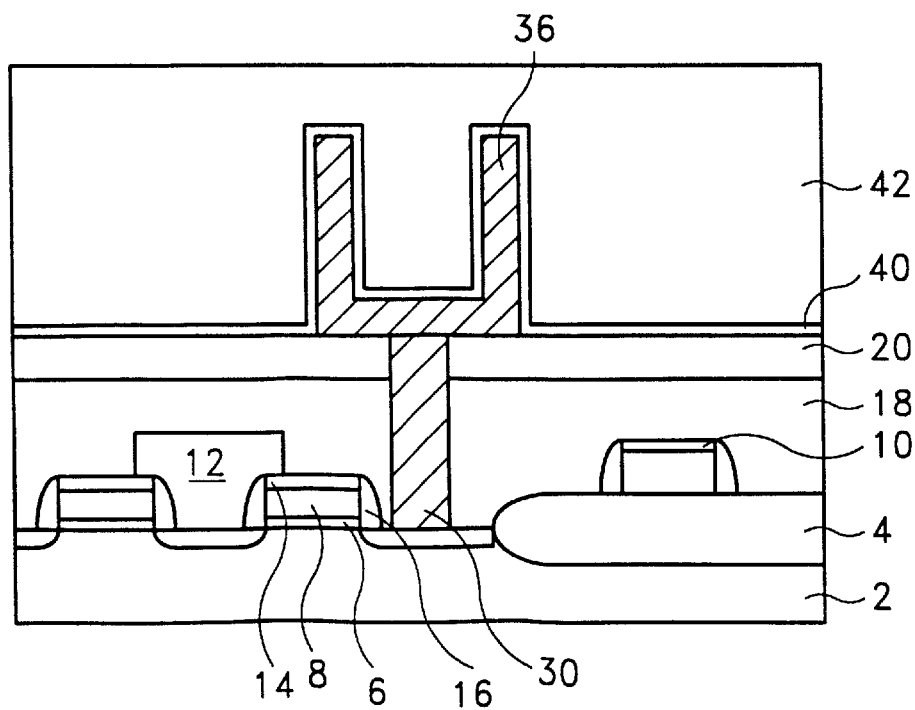
FIG. 7 is a cross sectional view of a semiconductor wafer illustrating the step of forming the second metal layer to be the top electrode of the capacitor.

Refer to FIG. 7, a removing step is performed to remove a portion of the photoresist layer 38 and a portion of the first metal layer 36 atop the oxide layer 34. In general, a CMP procedure can be used to polish and remove the portion of the photoresist layer 38 and the portion of the first metal layer 36 untill the oxide layer 34 is reached. Then, a wet etching step is used to remove the photoresist layer 38 and the oxide layer 34 atop the nitride layer 20. Typically, the diluted HF solution, BOE (buffer oxide etching) solution or other likes can be used to remove the oxide layer 34.

Then a thin dielectric film 40 is formed along the exposed surfaces of the first metal layer 36 and the nitride layer 20. In general, the thin dielectric film 40 can be chosen from a group of high dielectric ($\geqq 22$) materials such as $Ta_2O_5$, BST, PZT and PLZT. Subsequently, a second metal layer 42 is deposited along the surface of the dielectric film 40 to serve as the top electrode of the capacitor. The second metal layer can be chosen from a group of TiN, WN, Al, Cu, W, Pt, Ti, and alloy. Thus, as shown in FIG. 7, the MIM structure capacitor with a crown shaped bottom electrode is formed.

Figure 8:
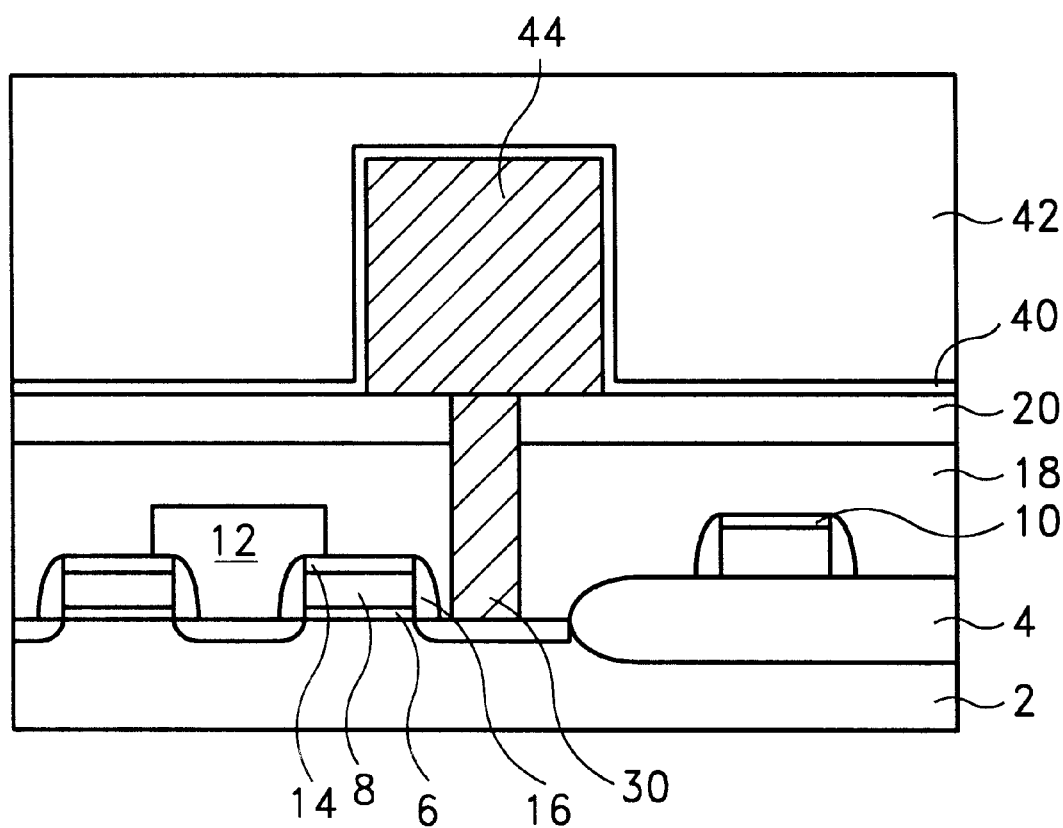
FIG. 8 is a cross sectional view of a semiconductor wafer illustrating the step of forming the box structure capacitor.

Refer to FIG. 8, the stacked box capacitor with an aluminum contact manufactured in accordance with the present invention is illustrated. a box shaped bottom electrode 44 is connected electrically to the devices on the substrate 2 through the aluminum contact 30. The thin dielectric film 40 and the second metal layer 42 are deposited atop the box shaped bottom electrode 44 in sequence. the detailed process is as follows.

Please refer to FIG. 3, as described above, the polysilicon contact 24 is filled into the contact hole 22. The aluminum layer 26 with a thickness about 3000 to 8000 angstrom is then deposited atop the nitride layer 20 and the polysilicon contact 24. The titanium layer 28 with a thickness about 500 to 2000 angstrom is formed on the aluminum layer 26 to serve as the silicon catching layer by using the PVD method.

Next, as shown in FIG. 4, the portion of the aluminum layer 26 is used to substitute in solid phase for the polysilicon contact 24 in the contact hole 22 by performing an annealing step to form the aluminum contact 30 in the contact hole 22. Similarly, the silicon atoms are driven upward to react with a portion of the titanium layer 28 for forming the titanium silicide ($TiSi_x$) layer 32 underneath the titanium layer 28. The titanium layer 28 and the titanium silicide layer 32 above the aluminum layer 26 are next removed. In an embodiment, the removing step is done by using the RIE procedure.

After removing the titanium layer 28 and the titanium silicide layer 32, the box pattern is defined on the aluminum layer 26. Typically, a photoresist is formed on the aluminum layer 26 firstly. Next a photolithography procedure is done to define the pattern on the photoresist. The aluminum layer 26 is etched by using the photoresist as a mask until the nitride layer 20 is reached. Accordingly, the first metal layer 44 with box shaped structure to be the bottom electrode is formed as illlustrated in FIG. 8. Then, as described above, the thin dielectric film 40 is formed along the exposed surfaces of the first metal layer 44 and the nitride layer 20. In general, the thin dielectric film 40 can be chosen from a group of high dielectric ($\geqq 20$) materials such as $Ta_2O_5$, BST, PZT and PLZT. Subsequently, a second metal layer 42 is deposited along the surface of the dielectric film 40 to serve as the top electrode of the capacitor. The second metal layer can be chosen from a group of TiN, WN, Al, Cu, W, Pt, Ti, and alloy. Thus, the MIM capacitor with a box shaped structure bottom electrode is formed as shown in FIG. 8.

The present invention can provide various benefits over the prior art. First, the polysilicon contact is replaced by the aluminum contact effectively in the contact hole based on the method of using the aluminum atoms to substitute in solid phase for the silicon atoms by thermal annealing. Thus, the inefficiency to fill the aluminum into the contact hole by using the PVD method is overcome. Especially, it is optimal to form the contact in the contact hole by using polysilicon due to the excellent ability for polysilicon layer deposited by the CVD method to fill into the contact hole. So after the aluminum contact is used to subsitute for the polysilicon contact completely, the aluminum contact in the contact hole is optimal, completely and effectively. Besides, even the defects such as voids occurring in the polysilicon contact, however, after the replacing step is done, the voids in the original polysilicon contact will disappear in the aluminum contact. Namely the aluminum contact has not the defects such as voids after the replacing step is done. Further, it is not required to form the barrier layer such as Ti/TiN on the sidewalls of the contact hole. Accordingly, the aluminum contact can be formed into the contact hole effectively and completely with the optimal filling efficiency by using the method provided in the present invention for the contact holes with higher aspect ratio.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for manufacturing a contact in an integrated circuit capacitor, the method comprising the steps of:

etching a semiconductor substrate to form a contact hole;

forming a polysilicon contact to fill into said contact hole;

forming a metal layer on said substrate and said polysilicon contact, wherein said metal layer is formed of aluminum (Al);

forming a silicon catching layer on said metal layer; and performing an annealing step to substitute said polysilicon contact in said contact hole with a portion of said metal layer, wherein said polysilicon contact reacts with said silicon catching layer to form a compound layer underneath said silicon catching layer.

2. The method of claim 1, further comprises following steps before etching said substrate to form said contact hole:

forming a silicon oxide layer on said substrate; and forming a silicon nitride layer on said silicon oxide layer.

3. The method of claim 1, wherein said silicon catching layer is formed of titanium (Ti).

4. The method of claim 1, wherein said annealing step is about 10 to 80 minutes at a temperature about 400 to 500° C.

5. The method of claim 1, wherein said compound layer is formed of titanium silicide (TiSi$_x$).

6. The method of claim 1, wherein said annealing step is used to drive the metal atoms of said metal layer into said contact hole for replacing in solid phase the silicon atoms of said polysilicon contact.

7. The method of claim 6, wherein said replaced silicon atoms are driven to reacts with said silicon catching layer through said metal layer for forming said compound layer.

8. A method for manufacturing an integrated circuit capacitor, the method comprising the steps of:

etching a semiconductor substrate to form a contact hole;

forming a polysilicon contact to fill into said contact hole;

forming an aluminum (Al) layer on said substrate and said polysilicon contact;

forming a titanium (Ti) layer on said aluminum layer;

performing an annealing step to substitute the silicon atoms of said polysilicon contact in said contact hole with the aluminum atoms of said aluminum layer for forming an aluminum contact in said contact hole, wherein said replaced silicon atoms are driven to react with said titanium layer to form a titanium silicide layer underneath said titanium layer;

removing said aluminum layer, said titanium silicide layer and said titanium layer atop said substrate and said aluminum contact;

forming a first conducting layer on said substrate and said aluminum contact to serve as the bottom electrode;

forming a dielectric film along an exposed surface of said first conducting layer; and forming a second conducting layer on said dielectric film to serve as the top electrode.

9. The method of claim 8, further comprises following steps before etching said substrate to form said contact hole:

forming a silicon oxide layer on said substrate; and forming a silicon nitride layer on said silicon oxide layer.

10. The method of claim 8, wherein said annealing step is about 10 to 80 minutes at a temperature about 400 to 500° C.

11. The method of claim 8, wherein said first conducting layer is formed of aluminum (Al).

12. The method of claim 9, wherein said dielectric film is selected from a group of Ta$_2$O$_5$, BST, PZT and PLZT.

13. The method of claim 8, wherein said second conducting layer is selected from a group of titanium nitride, tungsten nitride, copper, aluminum, tungsten, titanium, platinum and combinations thereon.

14. The method of claim 8, further comprising the following steps before forming said first conducting layer:

forming an oxide layer on said substrate and said aluminum contact; and defining a crown shaped pattern on said oxide layer to expose top surfaces of said aluminum contact and a portion of said substrate.

15. The method of claim 14, further comprising the following steps before forming said dielectric film:

forming a sacrificial layer to cover said first conducting layer;

removing a portion of said first conducting layer and said sacrificial layer until said oxide layer is reached; and removing said sacrificial layer and said oxide layer.

16. A method for manufacturing an integrated circuit capacitor, the method comprising the steps of:

etching a semiconductor substrate to form a contact hole;

forming a polysilicon contact to fill into said contact hole;

forming an aluminum (Al) layer on said substrate and said polysilicon contact;

forming a titanium (Ti) layer on said aluminum layer;

performing an annealing step to substitute the silicon atoms of said polysilicon contact in said contact hole with the aluminum atoms of said aluminum layer in solid phase for forming an aluminum contact in said contact hole, wherein said replaced silicon atoms are driven to react with said titanium layer for forming a titanium silicide layer underneath said titanium layer;

removing said titanium silicide layer and said titanium layer atop said aluminum layer;

etching said aluminum layer to define the bottom electrode pattern on said aluminum layer;

forming a dielectric film along an exposed surface of said aluminum layer; and forming a conducting layer on said dielectric film to serve as the top electrode.

17. The method of Claim 16, further comprises following steps before etching said substrate to form said contact hole:

forming a silicon oxide layer on said substrate; and forming a silicon nitride layer on said silicon oxide layer.

18. The method of Claim 16, wherein said annealing step is about 10 to 80 minutes at a temperature about 400 to 500° C.

19. The method of claim 16, wherein said dielectric film is selected from a group of Ta$_2$O$_5$, BST, PZT and PLZT.

20. The method of claim 16, wherein said conducting layer is selected from a group of titanium nitride, tungsten nitride, copper, aluminum, tungsten, titanium, platinum and combinations thereon.

* * * * *